United States Patent
Chen et al.

(10) Patent No.: US 6,867,142 B2
(45) Date of Patent: Mar. 15, 2005

(54) METHOD TO PREVENT ELECTRICAL SHORTS BETWEEN TUNGSTEN INTERCONNECTS

(75) Inventors: Yi-Nan Chen, Taipei (TW); Shing-Yih Shih, Taipei (TW); Hsien-Wen Liu, Taiwan (TW)

(73) Assignee: Nanya Technology Corporation, Taoyuan (TW)

( * ) Notice: Subject to any disclaimer, the term of this patent is extended or adjusted under 35 U.S.C. 154(b) by 233 days.

(21) Appl. No.: 10/247,422

(22) Filed: Sep. 18, 2002

(65) Prior Publication Data
US 2003/0139058 A1 Jul. 24, 2003

(30) Foreign Application Priority Data
Jan. 18, 2002 (TW) ........................ 91100822 A

(51) Int. Cl.[7] ........................ H01L 21/302; C09K 13/00
(52) U.S. Cl. ........................ 438/700; 438/703; 438/745; 252/79.1
(58) Field of Search ........................ 438/700, 703, 438/745; 252/79.1

(56) References Cited

U.S. PATENT DOCUMENTS

| | | | | |
|---|---|---|---|---|
| 6,001,726 A | * | 12/1999 | Nagabushnam et al. | 438/618 |
| 6,083,817 A | * | 7/2000 | Nogami et al. | 438/586 |
| 6,140,233 A | * | 10/2000 | Kwag et al. | 438/669 |
| 6,160,296 A | * | 12/2000 | Violette et al. | 257/377 |
| 6,319,801 B1 | * | 11/2001 | Wake et al. | 438/585 |
| 6,635,185 B2 | * | 10/2003 | Demmin et al. | 216/64 |

* cited by examiner

*Primary Examiner*—Nadine G. Norton
*Assistant Examiner*—Lynette T. Umez-Eronini
(74) *Attorney, Agent, or Firm*—Ladas & Parry LLP

(57) ABSTRACT

A method to prevent electrical shorts between tungsten interconnects. First, a semiconductor substrate having an insulating layer thereon is provided. Then, the insulating layer is selectively etched to form a trench for interconnect. Then, a titanium nitride film is conformally deposited on the surface of the trench and the insulating layer. A tungsten layer is then deposited to fill the trench. Next, the tungsten layer above the titanium nitride film is removed by an ammonia hydrogen peroxide mixture (APM) solution. Next, the titanium nitride film above the insulating layer is removed by a sulfuric acid hydrogen peroxide mixture (SPM) solution to leave a tungsten interconnect within the trench.

7 Claims, 3 Drawing Sheets

METHOD TO PREVENT ELECTRICAL SHORTS BETWEEN TUNGSTEN INTERCONNECTS

BACKGROUND OF THE INVENTION

1. Field of the Invention

The invention relates generally to the planarization of integrated circuit surfaces. More particularly, it relates to a chemical mechanical polishing process to prevent electrical shorts between tungsten interconnects.

2. Description of the Related Art

Semiconductor fabrication generally comprises providing tungsten or copper wiring or metallization in discrete layers of dielectric oxide film. Oxides typically used to form these film layers include phosphosilicate glass (PSG), borophosphosilicate glass (BPSG) or silicon dioxide. The oxide layer is then planarized using conventional planarization techniques. Thereafter, the oxide layer is etched or otherwise processed to pattern a series of trenches and holes therein. A thin liner film, generally not more than approximately 1,000 Angstroms thick is then deposited over the oxide layer. The liner generally comprises thin films of titanium (Ti) and titanium nitride (TiN) disposed over one another to form a Ti/TiN stack, or tantalum (Ta) and tantalum nitride (TaN) to form a Ta/TaN stack. Such a liner is commonly deposited by physical vapor deposition (PVD), otherwise known as sputter deposition, or it may be deposited by a chemical vapor deposition (CVD) to form a more conformed coating. Accordingly, the liner serves to coat the surfaces of the trenches and holes as well as the upper surface of the oxide layer and is used to provide good adhesion between the metallization layer and the oxide layer. The metallization is then provided by depositing a layer of tungsten (W) or copper (Cu), in the range of approximately 3,000–11,000 Angstroms thick, over the liner layer, wherein the W or Cu will completely fill the trenches and holes. Fabrication of the wiring layer is then completed by removing the liner film and the tungsten or copper layer from the surface of the oxide film. This is typically accomplished by the use of Chemical Mechanical Polishing (CMP). The CMP process involves holding the semiconductor material against a rotating polishing pad surface under controlled downward pressure. A polishing slurry such as a mixture of either a basic or acidic solution used as a chemical etch component in combination with alumina particles used as an abrasive etch component may be used. A rotating polishing head or wafer carrier is typically used to hold the semiconductor wafer under controlled pressure against a rotating polishing platen. The CMP process effectively removes the tungsten layer, however removal of the liner film has proven to be problematic. The liner is difficult to remove, tending to remain behind in localized topography caused by prior level damascene dishing/erosion, and in unplanarized features or defects such as scratches. In addition, while attempting to remove the remnants of this liner film, the relatively abrasive alumina based slurry used in the CMP process tends to damage the oxide layer by scratching and pitting the surface thereof. It is thus common practice to continue the CMP process until substantially all of the liner has been removed from the surface of the oxide, and then employ a second step commonly known as an "oxide touch up." This second step attempts to remove any residual liner material which may result in undesirable electrical shorts between tungsten interconnects, and replanarize the surface of the oxide to remove the scratches and other defects therein created by the CMP process. This oxide touch up step typically removes between 10 and 100 nanometers (nm), or between 100 and 1000 Angstroms of oxide.

This two-step approach, however, is not without significant drawbacks. In particular, the oxide touch up step is not always effective in removing the residual titanium and thus can cause additional erosion of the oxide layer, particularly in high pattern factor areas, or areas having a high density of metallization. In addition, the alumina-based slurry typically used in the CMP process is acidic whereas the oxide touch up chemical system is generally basic, wherein interaction between the two chemical systems can generate precipitates which complicate cleaning the slurry from the wafers. Moreover, the redundancy of planarizing the oxide surface a second time adds expense to the fabrication process while providing an opportunity for the introduction of further defects to the oxide surface. Thus, a need remains for an improved method of removing the tungsten or copper layer and a Ti/TiN or Ta/TaN liner film from the surface of an oxide layer which does not require an oxide touch-up step to essentially replanarize the surface of the oxide.

SUMMARY OF THE INVENTION

In view of the above disadvantages, an object of the invention is to provide a method to prevent electrical shorts between tungsten interconnects without a touch up step, thus reducing the manufacturing cost.

A further object of the invention is to provide a method to prevent electrical shorts between tungsten interconnects. According to the method, damage such as surface scratches can be eliminated.

Accordingly, the above objects are attained by providing a method to prevent electrical shorts between tungsten interconnects. A semiconductor substrate having an insulating layer thereon is provided. The insulating layer is selectively etched to form a trench for interconnect. A titanium nitride film is conformally deposited on the surface of the trench and the insulating layer. A tungsten layer is then deposited to fill the trench. The tungsten layer above the titanium nitride film is removed by an ammonia hydrogen peroxide mixture (APM) solution. Next, the titanium nitride film above the insulating layer is removed by a sulfuric acid hydrogen peroxide mixture (SPM) solution to leave a tungsten interconnect within the trench.

Alternately, the tungsten layer above the titanium nitride film is removed by chemical mechanical polishing. That is to say, chemical mechanical polishing can be used to replace the APM solution.

The insulating layer is preferably silicon oxide formed by chemical vapor deposition using tetra-ethyl-orthosilicate (TEOS) as the reactive gas. The insulating layer can be borophosphosilicate glass (BPSG) or borosilicate glass (BSG).

The ratio of ammonia water: hydrogen peroxide: water in the APM solution is preferably 1 to 5:1 to 5:400 to 500. The temperature of the APM solution is preferably between 15° C. and 30° C.

Also, the ratio of sulfuric acid: hydrogen peroxide: water in the SPM solution is 1 to 4:1 to 4:20. The temperature of the SPM solution is preferably between 45° C. and 60° C.

DETAILED DESCRIPTION OF THE INVENTION

The following description will explain the method to prevent electrical shorts between tungsten interconnects according to the preferred embodiments of the invention, which proceeds with reference to the accompanying drawings.

First Embodiment

Figure 1:
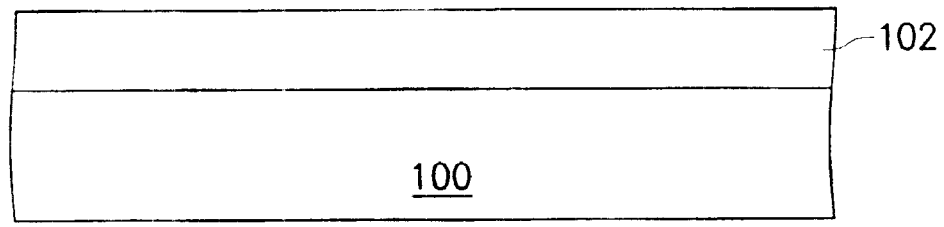
FIGS. 1 to 5 are cross-sections showing the manufacturing steps of the tungsten interconnects without undesirable shorts according to the embodiments of the invention.

As shown in FIG. 1, a semiconductor substrate 100 made of single-crystalline silicon is provided. Next, an insulating layer 102 of silicon oxide having a thickness of about 1000 to 3000 angstroms is deposited on the semiconductor substrate 100 by chemical vapor deposition (CVD) using tetra-ethyl-orthosilicate (TEOS) as the reactive gas.

Figure 2:
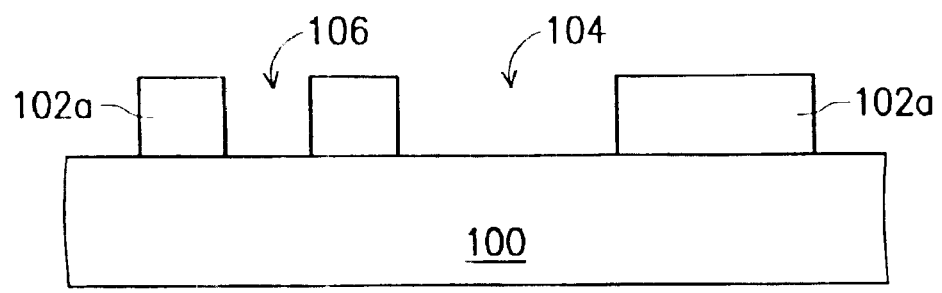

Referring to FIG. 2, a photoresist pattern (not shown) is formed on the insulating layer 102 by conventional photolithography comprising photoresist coating, photoresist exposing, and developing. The insulating layer 102 is anisotropically etched while the photoresist pattern is used as the etching mask to form trenches 104, 106 where interconnects will be formed and leave an insulating layer 102a.

Figure 3:
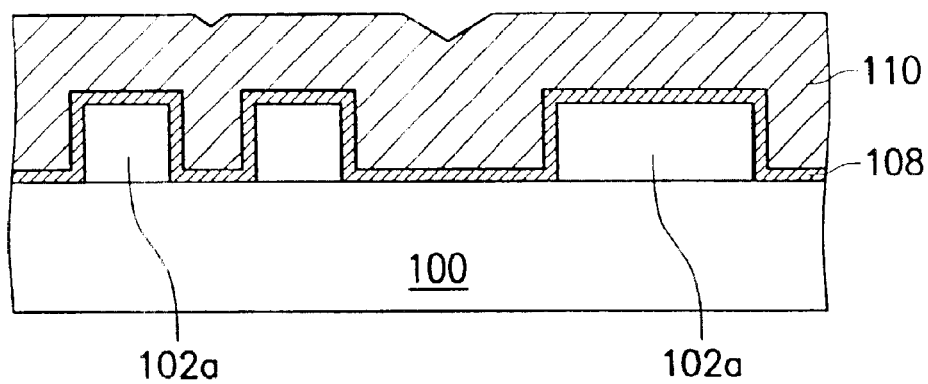

As shown in FIG. 3, a titanium nitride film 108 having thickness of about 500 to about 1000 angstroms is deposited on the insulating layer 102a and the upper surface of the trenches 104, 106. The titanium nitride film 108 serves as the liner layer. A tungsten layer 110, having a thickness of about 3000 to about 10000 angstroms, is globally deposited on the titanium nitride film 108 by chemical vapor deposition. The tungsten layer 110 fills the trenches 104, 106.

Figure 4:
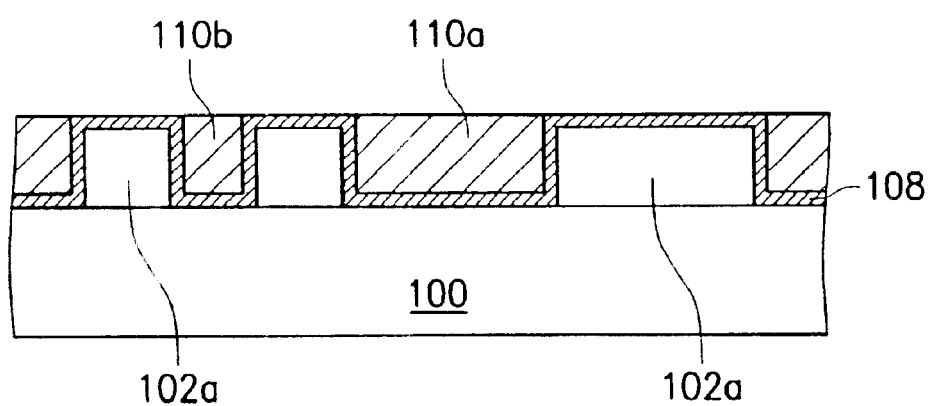

Next, as shown in FIG. 4, the tungsten layer 110 is planarized by chemical mechanical polishing using an acid slurry to expose the upper surface of the titanium nitride film 108 and leave tungsten structures 110a, 110b.

Figure 5:
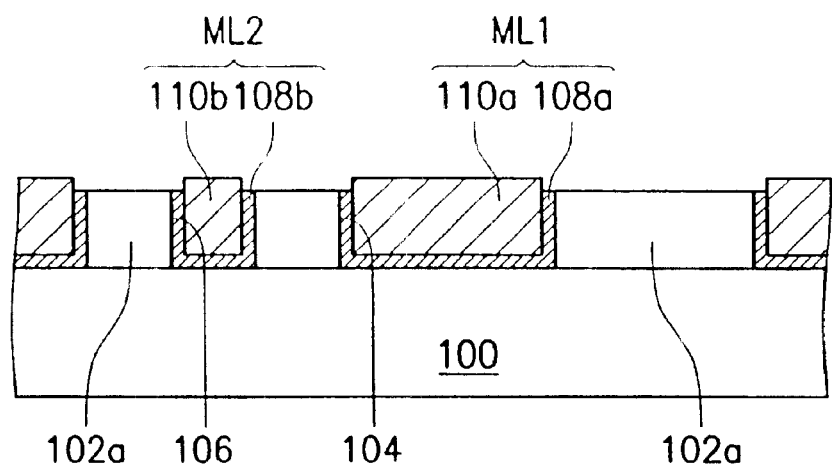

Then, as shown in FIG. 5, the exposed titanium nitride film 108 is removed by a sulfuric acid hydrogen peroxide mixture (SPM) solution at a temperature between 45° C. to 60° C. The ratio of sulfuric acid: hydrogen peroxide: water in the SPM solution is 1 to 4:1 to 4:20. In this step, the etching rate of titanium nitride film 108 can be controlled to about 100 with respect to the tungsten structures 110a, 110b. That is to say, the tungsten structures 110a, 110b can be conserved because the SPM solution is a high selectivity etchant. After this step, a first metal ML1 composed of the tungsten structure 110a and the titanium nitride film 108a and a second metal line ML2 composed of the tungsten structure 110b and the titanium nitride film 108b are formed.

Second Embodiment

FIGS. 1 to 5 also show the manufacturing steps of the tungsten interconnects without undesirable shorts according to the second embodiment of the invention.

The step as shown in FIG. 4 is changed, the tungsten layer 110 is partially removed by an ammonia hydrogen peroxide mixture (APM) solution at a temperature between 15° C. to 30° C. The ratio of ammonia water: hydrogen peroxide: water in the APM solution is 1 to 5:1 to 5:400 to 500. In this step, the etching rate of tungsten layer 110 can be controlled to about 10 with respect to the titanium nitride film 108. The etching end point can be easily controlled by the diluted APM solution using time-mode. Next, the ML1 and ML2 are formed as in the first embodiment in the subsequent step.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method to prevent electrical shorts between tungsten interconnects, comprising the steps of:
   (a) providing a semiconductor substrate having an insulating layer thereon;
   (b) selectively etching the insulating layer to form a trench for interconnect;
   (c) conformally depositing a titanium nitride film on the surface of the trench and the insulating layer;
   (d) depositing a tungsten layer to fill the trench;
   (e) removing the tungsten layer above the titanium nitride film by an ammonia hydrogen peroxide mixture (APM) solution; and
   (f) removing the titanium nitride film above the insulating layer by a sulfuric acid hydrogen peroxide mixture (SPM) solution to leave a tungsten interconnect within the trench.

2. The method to prevent electrical shorts between tungsten interconnects as claimed in claim 1, wherein the insulating layer is silicon oxide formed by chemical vapor deposition using tetra-ethyl-orthosilicate(TEOS) as the reactive gas.

3. The method to prevent electrical shorts between tungsten interconnects as claimed in claim 1, wherein the APM solution has a temperature between 15° C. and 30° C.

4. The method to prevent electrical shorts between tungsten interconnects as claimed in claim 1, wherein the SPM solution has a temperature between 45° C. and 60° C.

5. A method to prevent electrical shorts between tungsten interconnects, comprising the steps of:
   (a) providing a semiconductor substrate having an insulating layer thereon;
   (b) selectively etching the insulating layer to form a trench for interconnect;
   (c) conformally depositing a titanium nitride film on the surface of the trench and the insulating layer;
   (d) depositing a tungsten layer to fill the trench;
   (e) removing the tungsten layer above the titanium nitride film by chemical mechanical polishing; and
   (f) removing the titanium nitride film above the insulating layer by a sulfuric acid hydrogen peroxide mixture (SPM) solution to leave a tungsten interconnect within the trench.

6. The method to prevent electrical shorts between tungsten interconnects as claimed in claim 5, wherein the insulating layer is silicon oxide formed by chemical vapor deposition using tetra-ethyl-orthosilicate (TEOS) as the reactive gas.

7. The method to prevent electrical shorts between tungsten interconnects as claimed in claim 5, wherein the SPM solution has a temperature between 45° C. and 60° C.

* * * * *